United States Patent
Fossum et al.

(10) Patent No.: US 6,943,838 B2
(45) Date of Patent: *Sep. 13, 2005

(54) ACTIVE PIXEL SENSOR PIXEL HAVING A PHOTODETECTOR WHOSE OUTPUT IS COUPLED TO AN OUTPUT TRANSISTOR GATE

(75) Inventors: Eric R. Fossum, La Crescenta, CA (US); Junichi Nakamura, Tokyo (JP); Sabrina E. Kemeny, La Crescenta, CA (US)

(73) Assignee: California Institute of Technology, Pasadena, CA (US)

( * ) Notice: Subject to any disclaimer, the term of this patent is extended or adjusted under 35 U.S.C. 154(b) by 894 days.

This patent is subject to a terminal disclaimer.

(21) Appl. No.: 09/749,989

(22) Filed: Dec. 26, 2000

(65) Prior Publication Data

US 2001/0002848 A1 Jun. 7, 2001

Related U.S. Application Data

(63) Continuation of application No. 08/785,931, filed on Jan. 22, 1997, now Pat. No. 6,166,768, which is a continuation-in-part of application No. 08/558,521, filed on Nov. 16, 1995, now Pat. No. 6,101,232, which is a continuation of application No. 08/188,032, filed on Jan. 28, 1994, now Pat. No. 5,471,515.
(60) Provisional application No. 60/010,305, filed on Jan. 22, 1996, and provisional application No. 60/013,700, filed on Mar. 20, 1996.

(51) Int. Cl.$^7$ .................................................. H04N 3/14
(52) U.S. Cl. ...................... 348/311; 348/294; 348/308; 348/298
(58) Field of Search ................................. 348/308, 302, 348/294, 298, 311, 250, 304, 241; 257/239

(56) References Cited

U.S. PATENT DOCUMENTS

| | | | | |
|---|---|---|---|---|
| 4,644,287 A | * | 2/1987 | Levine | 329/50 |
| 4,779,004 A | | 10/1988 | Tew et al. | 250/578 |
| 5,049,961 A | * | 9/1991 | Zommer et al. | 257/470 |
| 5,138,415 A | * | 8/1992 | Yano | 257/113 |
| 5,196,939 A | | 3/1993 | Elabd et al. | |

(Continued)

OTHER PUBLICATIONS

Sunetra Mendis et al., " CMOS Active Pixel Sensor", IEEE Transactions on Electron Devices, vol. 41, No. 3, Mar. 1994, p. 452–453.*

(Continued)

*Primary Examiner*—Wendy R. Garber
*Assistant Examiner*—Nelson D. Hernandez
(74) *Attorney, Agent, or Firm*—Fish & Richardson P.C.

(57) ABSTRACT

An imaging device formed as a monolithic complementary metal oxide semiconductor integrated circuit in an industry standard complementary metal oxide semiconductor process, the integrated circuit including a focal plane array of pixel cells, each one of the cells including a photogate overlying the substrate for accumulating photo-generated charge in an underlying portion of the substrate and a charge coupled device section formed on the substrate adjacent the photogate having a sensing node and at least one charge coupled device stage for transferring charge from the underlying portion of the substrate to the sensing node. There is also a readout circuit, part of which can be disposed at the bottom of each column of cells and be common to all the cells in the column. A Simple Floating Gate (SFG) pixel structure could also be employed in the imager to provide a non-destructive readout and smaller pixel sizes.

33 Claims, 8 Drawing Sheets

U.S. PATENT DOCUMENTS

| | | | |
|---|---|---|---|
| 5,262,871 A | | 11/1993 | Wilder et al. |
| 5,327,234 A | | 7/1994 | Creswick .................... 348/399 |
| 5,331,421 A | * | 7/1994 | Ohzu et al. .................. 340/262 |
| 5,369,039 A | * | 11/1994 | Hynecek ...................... 438/60 |
| 5,440,343 A | | 8/1995 | Parulski et al. |
| 5,471,515 A | * | 11/1995 | Fossum et al. ............... 377/60 |
| 5,473,660 A | * | 12/1995 | Bastiaens et al. .......... 378/98.8 |
| 5,493,335 A | | 2/1996 | Parulski et al. |
| 5,631,704 A | * | 5/1997 | Dickinson et al. .......... 348/308 |
| 5,682,203 A | * | 10/1997 | Kato ........................... 348/340 |
| 6,101,232 A | * | 8/2000 | Fossum et al. ............... 377/60 |
| 6,166,768 A | * | 12/2000 | Fossum et al. ............. 348/308 |
| 6,243,131 B1 | * | 6/2001 | Martin ......................... 348/36 |
| 2001/0002848 A1 | * | 6/2001 | Fossum et al. ............. 348/311 |

OTHER PUBLICATIONS

Eric R. Fossum, " Standard CMOS Active Pixel Image Sensors for Multimedia applications", IEEE, 1995, pp. 214–224.*

Eric R. Fossum, "CMOS Image Sensors: Electronic Camera On A Chip", IEEE, 1995, pp. 17–25.*

Sunetra K Mendis et al., "A 128×128 CMOS Active Pixel Image Sensor for Highly Integrated Imaging Systems",IEEE Electron Devices Meeting, Dec. 1993. Technical Digest, International, pp. 583–586.*

Jun–ichi Nakamura et al., CMOS Active Pixel Image Sensor with Simple Floating Gate Pixels, IEEE Transactions on Electron Devices, vol. 42, No. 9, Sep. 1995, pp. 1693–1694.*

Eric R. Fossum, "Ultra Low Power Imaging Systems Using CMOS image Sensor Technology", SPIE, vol. 2267, Advanced Microdevices and Space Science Sensors, Sep. 1994, pp. 107–111.*

Sunetra k Mendis et al., "Low–Light Level image Sensor with On–Chip Signal Processing", Proceedings of SPIE, vol. 1952, SPIE, Surveillance Technologies and Imaging Components, Nov. 1993, pp. 23–33.*

E.R. Fossum, "Active Pixel Sensors—Are CCDs Dinosaurs?", Proc. SPIE vol. 1900, paper 1 (Feb. 1993).*

S. Mendis et al., "Design of a low–light–level sensor with an . . . " Proc. SPIE vol. 1900, paper 4 (Feb. 1993).*

Fossum et al. Application of the Active Pixel Sensor Concept to Guidance and Navigation, SPIE, vol. 1949 paper 30 (1993).

Mendis et al., , Progress in CMOS Active Pixel Image Sensors, SPIE vol. 2172:1–11 (1994).

* cited by examiner

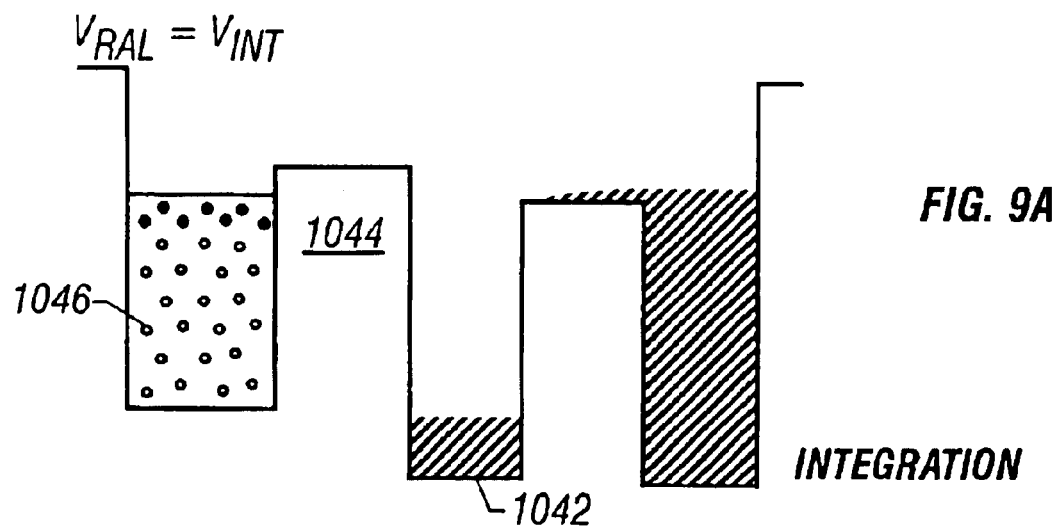
FIG. 9A INTEGRATION
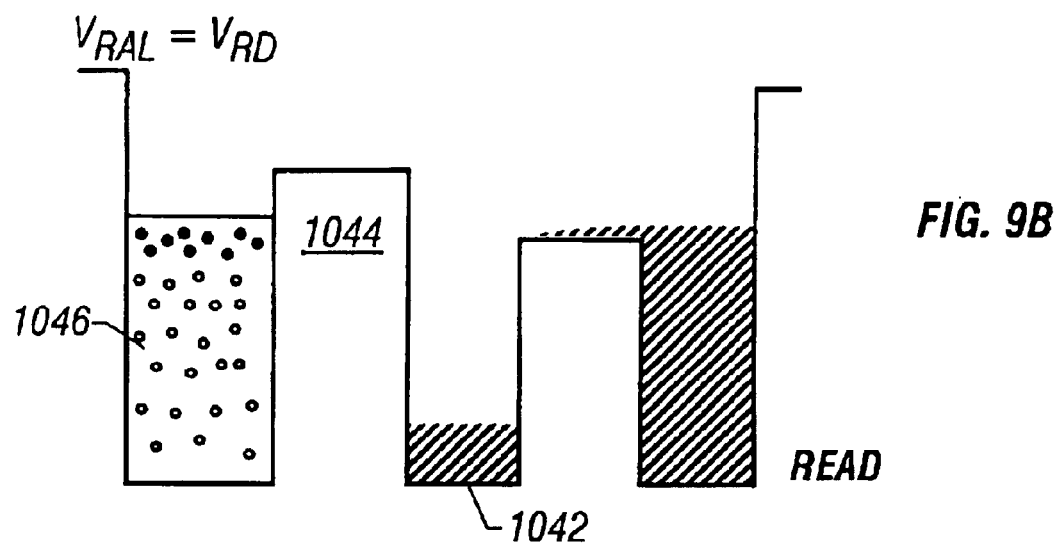
FIG. 9B READ
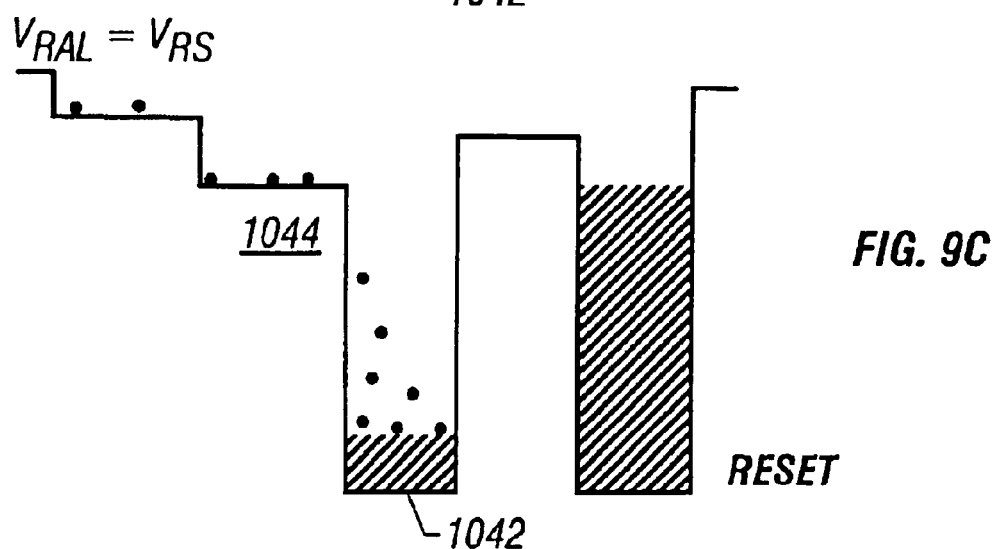
FIG. 9C RESET

ACTIVE PIXEL SENSOR PIXEL HAVING A PHOTODETECTOR WHOSE OUTPUT IS COUPLED TO AN OUTPUT TRANSISTOR GATE

RELATED APPLICATIONS

This application is a continuation of Ser. No. 08/785,931 filed Jan. 22, 1997 now U.S. Pat. No. 6,166,768 which is a cotinuation-in-part of U.S. patent application Ser. No. 08/558,521 filed Nov. 16, 1995 now U.S. Pat. No. 6,101,232, which is a continuation of Ser. No. 08/188,032 filed Jan. 28, 1994 now U.S. Pat. No. 5,471,515 entitled ACTIVE PIXEL SENSOR WITH INTRA-PIXEL CHARGE TRANSFER by Eric R. Fossum et al. and assigned to the present assignee. This application also claims priority from provisional application No. 60/010,305, filed Jan. 22, 1996, and from provisional application No. 60/013,700, filed Mar. 20, 1996.

ORIGIN OF THE INVENTION

The invention described herein was made in the performance of work under a NASA contract, and is subject to the provisions of Public Law 96-517 (35 USC 202) in which the Contractor has elected to retain title.

FIELD OF THE INVENTION

The invention is related to semiconductor imaging devices. More specifically, the present invention relates to a silicon imaging device which can be fabricated using a CMOS compatible process, and specific improved techniques that are used by such a system.

BACKGROUND AND SUMMARY

Many semiconductors can be used for acquiring a signal indicative of an image. Charge coupled devices (CCDs), photodiode arrays, charge injection devices and hybrid focal plane arrays are some of the more commonly used devices. CCDs are often used, since they represent a mature technology, are capable of large formats and very small pixel size and they facilitate noise-reduced charge domain processing techniques such as binning and time delay integration.

However, CCD imagers suffer from a number of drawbacks. For example, the signal fidelity of a CCD decreases as the charge transfer efficiency is raised to the power of the number of stages. Since CCDs use many stages, the CCD fabrication technique needs to be optimized for very efficient charge transfer efficiency. CCDs are also susceptible to radiation damage, require good light shielding to avoid smear and have high power dissipation for large arrays.

The specialized CCD semiconductor fabrication process is intended to maximize the charge transfer efficiency of the CCD. This specialized CCD process, however, has been incompatible with the complementary metal oxide semiconductor ("CMOS") processing which has been conventionally used. The image signal processing electronics required for the imager are often fabricated in CMOS. Accordingly, it has been difficult to integrate on-chip signal processing electronics in a CCD imager, because of the incompatibility of the processing techniques. Because of this problem, the signal processing electronics has often been carried out off-chip.

Typically, each column of CCD pixels is transferred to a corresponding cell of a serial output register, whose output is amplified by a single on-chip amplifier (e.g., a source follower transistor) before being processed in off-chip signal processing electronics. This architecture limits the read-out frame rate which the on-chip amplifier can handle proportional to the number of charge packets divided by the number of pixels in the imager.

The other types of imager devices have problems as well. Photodiode arrays exhibit high kTC noise. This makes it impractical to reset a diode or capacitor node to the same initial voltage at the beginning of each integration period. Photodiode arrays also suffer from lag. Charge injection devices also have high noise.

Hybrid focal plane arrays exhibit less noise but are prohibitively expensive for many applications and have relatively small array sizes.

In view of the inventor's recognition of the above problems, it is one object of the present invention to provide an imager device which has the low kTC noise level of a CCD without the associated CMOS incompatibility and other above-described problems.

In a preferred embodiment, the sensing node of the charge coupled device section includes a floating diffusion, and the charge coupled device stage includes a transfer gate overlying the substrate between the floating diffusion and the photogate. This preferred embodiment can further include apparatus for periodically resetting a potential of the sensing node to a predetermined potential, including a drain diffusion connected to a drain bias voltage and a reset gate between the floating diffusion and the drain diffusion, the reset gate connected to a reset control signal.

The imaging device also includes a readout circuit having at least an output transistor. Preferably, the output transistor is a field effect source follower output transistor formed in each one of the pixel cells, the floating diffusion being connected to its gate. Also, the readout circuit can further include a field effect load transistor connected to the source follower output transistor, and preferably a correlated double sampling circuit having an input node connected between the source follower output transistor and load transistor. The focal array of cells is also preferably organized by rows and columns, and the readout circuit has plural load transistors and plural correlated double sampling circuits. In this case, each cell in each column of cells is connected to a single common load transistor and a single common correlated double sampling circuit. These common load transistors and correlated double sampling circuits are disposed at the bottom of the respective columns of cells to which they are connected.

In the preferred implementation, charge is first accumulated under the photogate of a pixel cell. Next, the correlated double sampling circuit samples the floating diffusion immediately after it has been reset, at one capacitor. The accumulated charge is then transferred to the floating diffusion and the sampling process is repeated with the result stored at another capacitor. The difference between the two capacitors is the signal output. In accordance with a further refinement, this difference is corrected for fixed pattern noise by subtracting from it another difference sensed between the two capacitors while they are temporarily shorted.

The imaging device can also have a micro-lens layer overlying the substrate. This micro-lens layer includes a refractive layer and individual lenses formed in the layer which are in registration with individual ones of the cells. Each of the individual lenses has a curvature for focusing light toward a photosensitive portion of the respective cell.

The imaging device could also use a Simple Floating Gate ("SFG") pixel structure. This SFG pixel allows non-destructive readout due to the floating gate configuration. As described herein, the device made using the SFG has fewer components. Therefore, the system allows the use of smaller pixel sizes. The SFG pixel structure described herein forms to construct high density arrays that allow a non-destructive readout. An array of SFG pixels includes a monolithic semiconductor integrated circuit substrate and is organized by rows and columns, as with previously-described imager embodiments. However, each SFG pixel cell includes a photogate overlying the substrate which operates to accumulate photo-generated charge thereunder. A coupling capacitor is connected between the photogate and a row address line. The row address line is common to all the pixel cells in a row of the array, a barrier gate overlies the substrate adjacent to the photogate. The barrier gate is connected to a barrier gate bias voltage. In addition, a readout circuit including an output transistor is preferably formed in each one of the cells. This output transistor has a source and drain diffusion formed in said substrate and a gate overlying said substrate between said source and drain diffusions. The drain diffusion is connected to a drain bias voltage, the output transistor gate is connected to the photogate, and the source diffusion is connected to a column signal line which is common to all the pixel cells in a column of the array. Preferably, a load transistor is also connected to the output transistor, as well as a noise suppression circuit. The load transistor and noise suppression circuit are preferably connected to the output transistor via the column signal line, thereby creating a common load transistor and noise suppression circuit for every pixel cell in the column of the array. Therefore, each column of the array would have a separate load transistor and noise suppression circuit. In addition, the load transistors and noise suppression circuits are disposed at the bottom of the respective columns of cells connected thereto. The noise suppression circuit is preferably the same as the previously-described correlated double sampling circuit.

The SFG pixel operates in an integrating mode by biasing the photogate to a voltage greater than the barrier gate bias voltage. This allows charge to accumulate in the portion of the substrate underlying the photogate. Also, the drain bias voltage exceeds the photogate bias voltage and the barrier gate bias voltage is set so as to prevent blooming by causing charge in excess of a prescribed amount to drain to a potential well created under the drain diffusion of the output transistor by the drain bias voltage. The pixel is readout by increasing the photogate bias voltage to a level exceeding other pixels not being readout. In order to facilitate the noise suppression process, the readout process is preferably done twice, once after charge has been accumulated in the integration period, and once after the pixel has been reset. The pixel is reset by lowering the photogate bias voltage to a level below that of the barrier gate bias voltage. Since the barrier gate voltage is lower than the drain bias voltage, the accumulated charge drains from the portion of the substrate underlying the photogate to the potential well created under the drain diffusion of the output transistor by the drain bias voltage.

It is also noted that an array of SFG pixels preferably includes the micro-lens layer overlying said substrate. The microlens layer is employed to focus light toward a photosensitive portions of the cells.

In addition to the just described benefits, other objectives and advantages of the present invention will become apparent from the detailed description which follows hereinafter when taken in conjunction with the drawing accompanying figures.

BRIEF DESCRIPTION OF THE DRAWINGS

These and other aspects of the invention will now be described in detail with reference to the accompanying drawings, wherein:

FIGS. 9A–9C are surface potential graphs for the pixel cell of FIG. 7, where FIG. 9A represents the surface potential during the integration phase, FIG. 9B represents the surface potential during the readout phase, and FIG. 9C represents the surface potential during the reset phase.

DETAILED DESCRIPTION OF THE PREFERRED EMBODIMENTS

Figure 1:
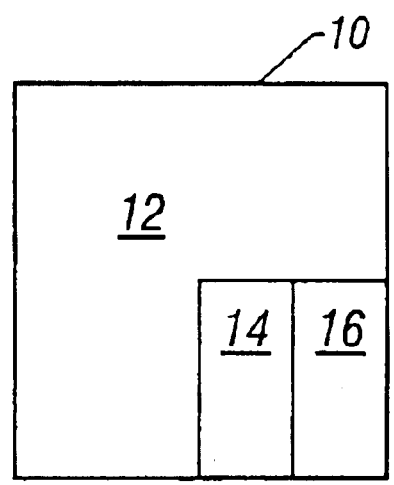
FIG. 1 is a diagram illustrating the architecture of a preferred individual focal plane cell.
Figure 2:
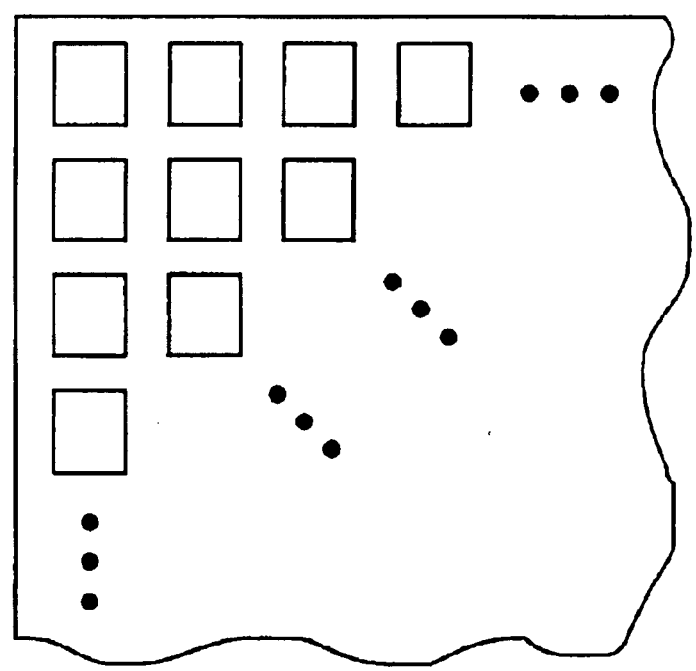
FIG. 2 is a plan view of an integrated circuit having a focal plane array of cells of the type illustrated in FIG. 1.

FIG. 1 is a simplified block diagram of one pixel cell 10 of a focal plane array of many such cells formed in an integrated circuit. Each cell 10 includes a photogate 12, a charge transfer section 14 adjacent the photogate 12 and a readout circuit 16 adjacent the charge transfer section 14. FIG. 2 shows a focal plane array of many cells 10 formed on a silicon substrate 20.

Figure 3A:
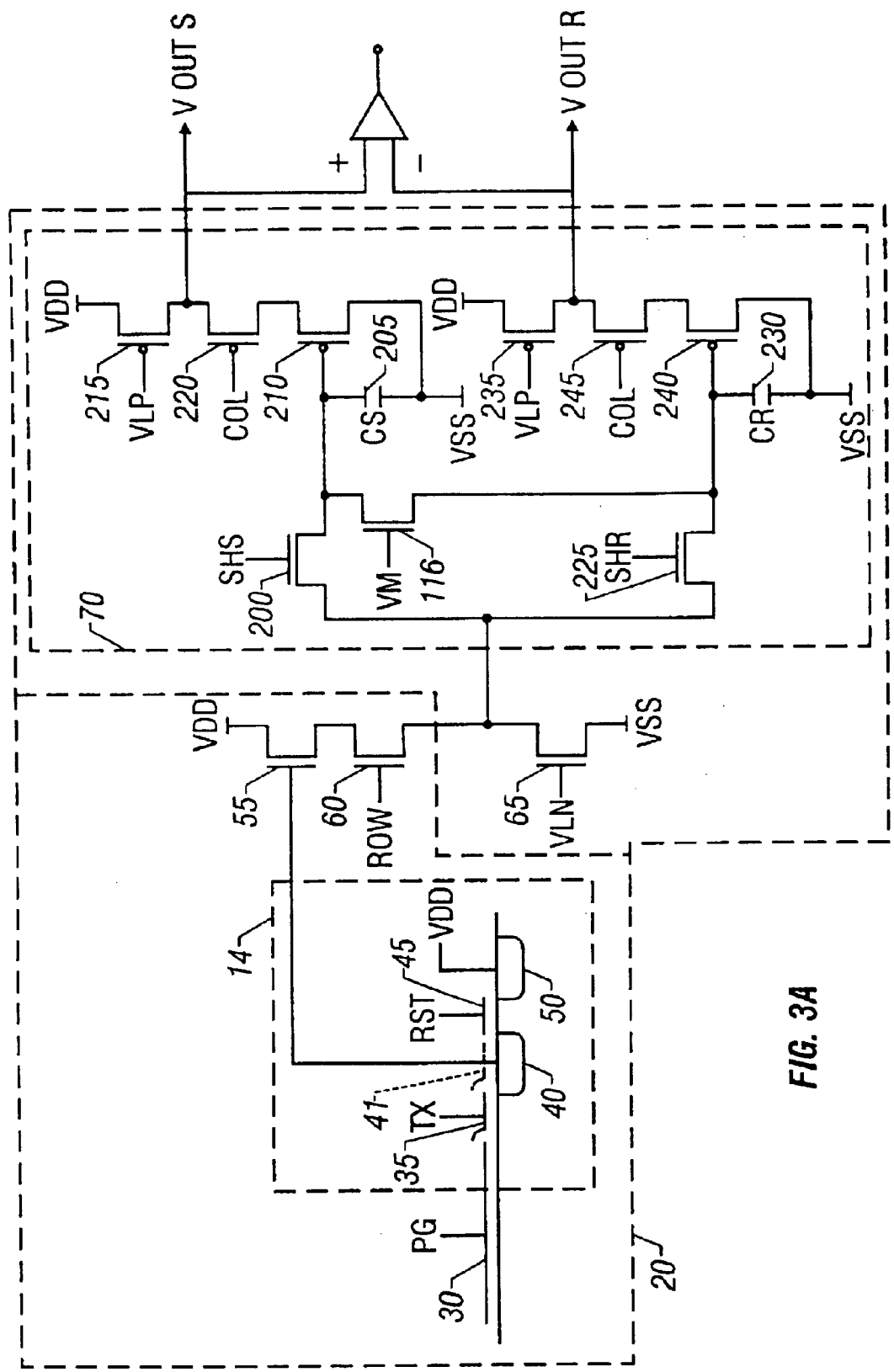
FIG. 3A is a schematic diagram of the cell of FIG. 1.

FIG. 3A is a simplified schematic diagram of a cell 10 and its associated processing. Each pixel 300 includes a photogate area and its associated circuitry (30–50) and row decoder elements 55,60. FIG. 3A shows the photogate 12 having a relatively large photogate electrode 30 overlying the substrate. The charge transfer section 14 has a transfer gate electrode 35 adjacent the photogate electrode 30, a floating diffusion 40, a reset electrode 45 and a drain diffusion 50. The readout circuit 16 has a source follower field effect transistor (FET) 55, a row select FET 60, a load FET 65 and a correlated double sampling circuit 70.

Figure 4:
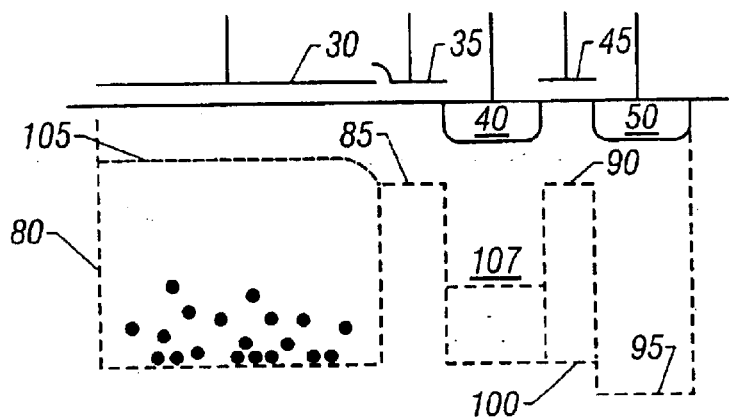
FIG. 4 is a graph of the surface potential in the charge transfer section of the cell of FIG. 3A.

The surface potential diagram of FIG. 4 shows the photogate electrode 30 being held by a photogate signal PG at a positive voltage to form a potential well 80 in the substrate 20 in which photo-generated charge is accumulated during an integration period. The transfer gate electrode 35 is initially held at a less positive voltage by a transfer gate signal TX to form a potential barrier 85 adjacent the potential well 80. The floating diffusion 40 is connected to the gate of the source follower FET 55 whose drain is connected to a drain supply voltage VDD. The reset electrode 45 is initially held by a reset signal RST at a voltage corresponding to the voltage on the transfer gate 30 to form a potential barrier 90 thereunder. The drain supply voltage VDD connected to the drain diffusion 50 creates a constant potential well 95 underneath the drain diffusion 50.

During the horizontal scanning period, electrons accumulate in the potential well 80 in proportion to photon flux incident on the substrate 20 beneath the photogate electrode 30. At the end of the integration period, the surface potential beneath the floating diffusion 40 is quickly reset to a potential level 100 slightly above the potential well 95. This is accomplished by the reset signal RST temporarily increasing to a higher positive voltage to temporarily remove the potential barrier 90 and provide a downward potential staircase from the transfer gate potential barrier 85 to the drain diffusion potential well 95, as indicated in the drawing of FIG. 4. After the reset gate 45 is returned to its initial potential (restoring the potential barrier 90), the readout circuit 70 briefly samples the potential of the floating diffusion 40, and then the cell 10 is ready to transfer the photo-generated charge from beneath the photogate electrode 30. For this purpose, the photogate signal PG decreases to a less positive voltage to form a potential barrier 105 beneath the photogate electrode 30 and thereby provide a downward staircase surface potential from the photogate electrode 30 to the potential well 100 beneath the floating diffusion 40. This operation transfers the charge from beneath the photogate electrode 30 to the floating diffusion 40, changing the potential of the floating diffusion 40 from the level (100) at which it was previously reset to a new level 107 indicative of the amount of charge accumulated during the integration period. This new potential of the floating diffusion 40 is sensed at the source of the source follower FET 55. However, before the readout circuit 70 samples the source of the source follower FET 55, the photogate signal PG returns to its initial (more positive) voltage. The entire process is repeated for the next integration period.

The readout circuit 70 has a signal sample and hold (S/H) circuit including an S/H FET 200 and a signal store capacitor 205 connected through the S/H FET 200 and through the row select FET 60 to the source of the source follower FET 55. The other side of the capacitor 205 is connected to a source bias voltage VSS. The one side of the capacitor 205 is also connected to the gate of an output FET 210. The drain of the output FET is a connected through a column select FET 220 to a signal sample output node VOUTS and through a load FET 215 to the drain voltage VDD. A signal called "signal sample and hold" (SHS) briefly turns on the S/H FET 200 after the charge accumulated beneath the photogate electrode 30 has been transferred to the floating diffusion 40, so that the capacitor 205 stores the source voltage of the source follower FET 55 indicating the amount of charge previously accumulated beneath the photogate electrode 30.

The readout circuit 70 also has a reset sample and hold (S/H) circuit including an S/H FET 225 and a signal store capacitor 230 connected through the S/H FET 225 and through the row select FET 60 to the source of the source follower FET 55. The other side of the capacitor 230 is connected to the source bias voltage VSS. The one side of the capacitor 230 is also connected to the gate of an output FET 240. The drain of the output FET 240 is connected through a column select FET 245 to a reset sample output node VOUTR and through a load FET 235 to the drain voltage VDD. A signal called "reset sample and hold" (SHR) briefly turns on the S/H FET 225 immediately after the reset signal RST has caused the resetting of the potential of the floating diffusion 40, so that the capacitor 230 stores the voltage to which the floating diffusion has been reset.

The readout circuit provides a special form of correlated double sampling of the potential of the floating diffusion, allowing the charge integrated beneath the photogate 12 during each integration period to be obtained at the end of each integration period from the difference between the voltages at the output nodes VOUTS and VOUTR of the readout circuit 70. This minimizes the effects of kTC noise because the difference between VOUTS and VOUTR is independent of any variation in the reset voltage RST.

Figure 5:
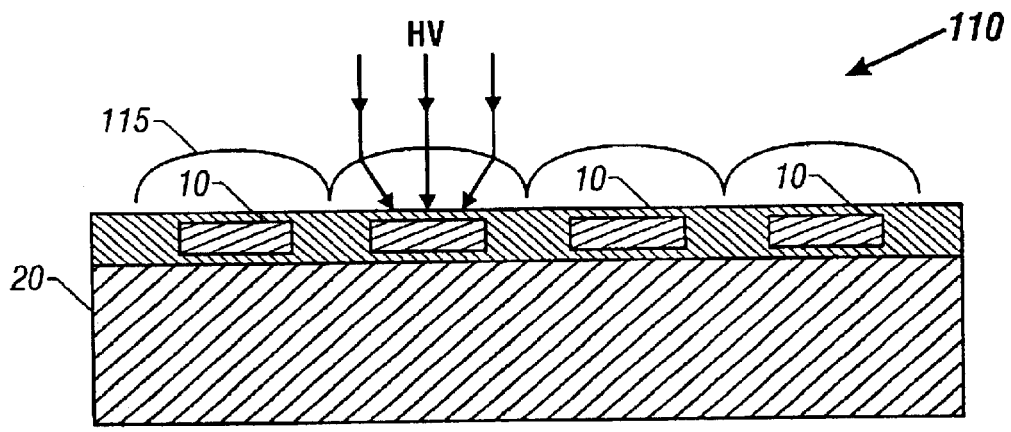
FIG. 5 is a cross-sectional view of an alternative embodiment of the focal plane array of FIG. 2 including a microlens layer.

FIG. 5 shows a transparent refractive microlens layer 110 which may be deposited over the top of the focal plane array of FIG. 2. The microlens layer 110 has spherical portions 115 centered over each of the cells 10 and contoured so as to focus light toward the center of each photogate 12. This has the advantage of using light that would otherwise fall outside of the optically active region of the photogate 12. For example, at least some of the light that is ordinarily incident on either the charge transfer section 14 or the readout circuit 16 (FIG. 1) would be sensed in the photogate area with the addition of the microlens layer 110. This has the effect of maximizing real estate—the portions of the substrate which include the non-photogate area are focused to another point.

Figure 6:
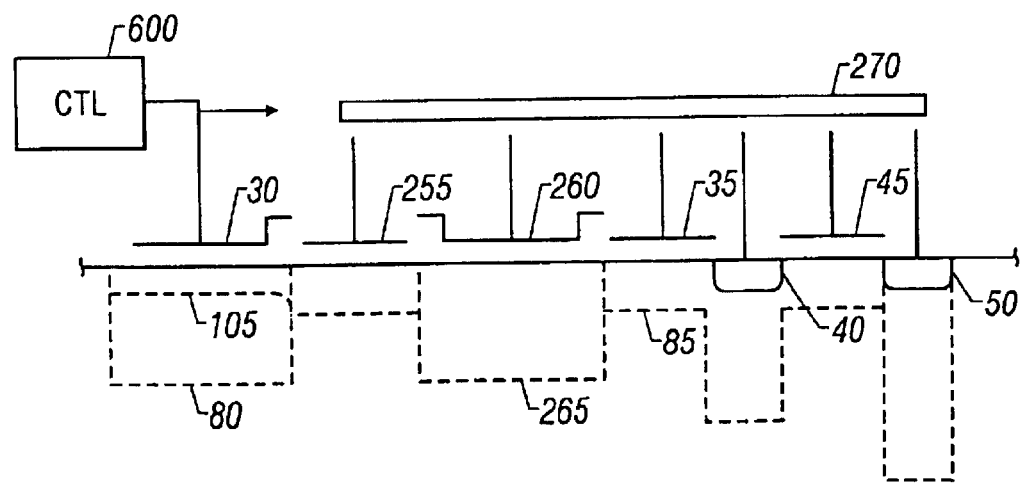
FIG. 6A shows a polymer filter embodiment.
FIG. 6B shows a phosphor embodiment.
FIG. 6C is a schematic diagram of an alternate embodiment of the cell of FIG. 3A with a storage well and an additional charge coupled device stage, and includes a graph of the surface potential in the charge transfer section.
Figure 6A:
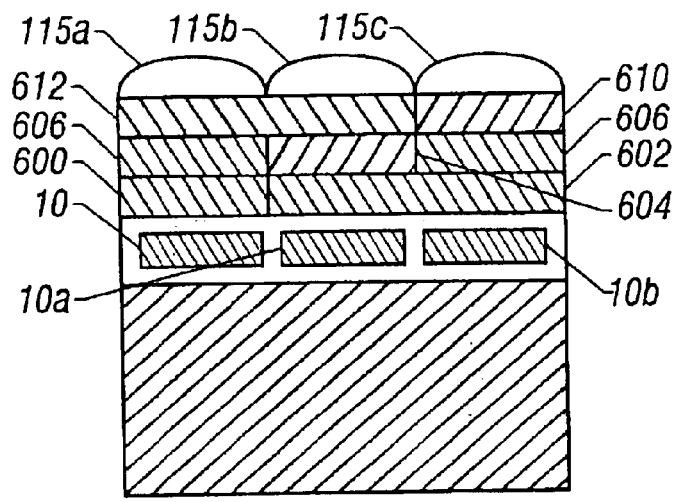
Figure 6B:
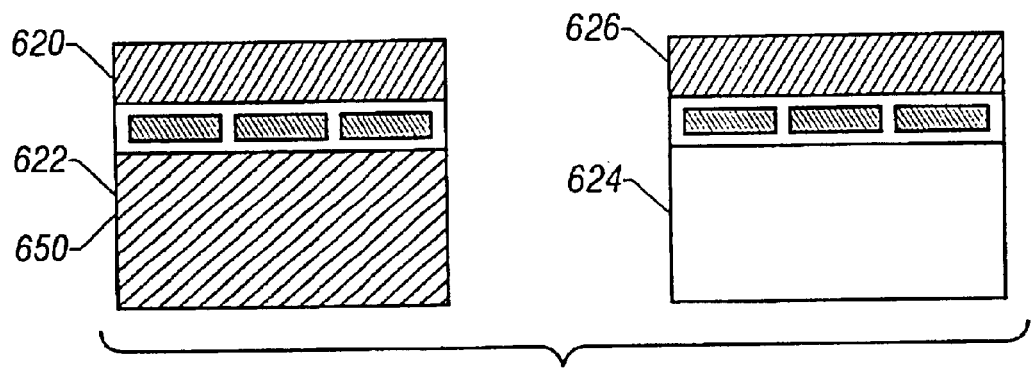

FIGS. 6A and 6B show an alternative embodiment of the invention which uses color filtering. Color filtering enables spatial separation of color in an imaging device. CCD devices, for example, commonly use kind of color separation in this way.

The preferred system allows a plurality of pixels to have different color filtering properties to provide a color filtering effect. Typically this is done by using the color filters in some array form: For example, alternate green filters interspersed with red and blue filters. An exemplary filter operation would use green/red/green/blue/green/red/green/blue with that pattern continuing for the length of the array.

According to this embodiment of the present invention, color filters are used to supplement the lens operation of FIG. 5.

The preferred system embodies its operation in one of the two forms shown in FIGS. 6A and 6B. The first form shown in FIG. 6A uses a polymer color filter array. Such polymer color filter arrays are well-known in the art. Layer 600 is preferably a red layer, and is first deposited over the entire chip. Subsequent to deposition, an etching technique is used to remove the red filter area 600 from everywhere except over the desired pixel 10. A planarization layer 602 covers the removed areas to thereby planarize that surface, thereby flattening the surface. Blue filter 604 is next deposited over pixel 10A. Blue filter 604 is similarly etched such that it only covers the desired pixel 10A. The remaining area is planarized by a second planarization layer 606. Finally, a green filter 610 is formed over that planarized layer, covering pixel 10B. Planarization layer 612 flattens the resulting area so that green filter 610 only covers the pixel 10B.

Each pixel, including the polymer layer, is covered by microlens 115A; 155B and 115C. The microlenses modify the incoming light in conjunction with the polymer layer. The light is therefore changed by both microlenses 115A–115C and CFA parts 612, 606, and 600. Each pixel, therefore, preferably receives light that has been doubly modified in this way.

This polymer color filter array causes the device to lose a certain amount of resolution of the scene being imaged since some of the pixels are dedicated to a different color.

An alternative embodiment shown in FIG. 6B does not lose resolution, but instead requires multiple chips to form any image. This would form a 3-chip camera. One chip 650 has all its pixels covered by a red filter 620. Hence that chip images the red scene—either the red components or the complement to the red components. Analogously, the other chips include green filters and blue filters. The three chips together form the entire image.

Figure 6C:
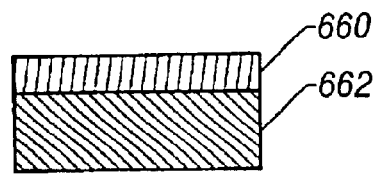

Yet another embodiment uses a wavelength-converting phosphor 660 as shown in FIG. 6C. A wavelength-converting phosphor is typically tuned to accept radiation of a desired wavelength, e.g., ultra-violet or x-ray. Typically the silicon underlayer is not responsive to that same wavelength. Therefore, the phosphor emits a photon of the proper type to properly excite the underlying silicon 662, when receiving this radiation. A preferred example is that the phosphor 660 is sensitive to x-ray, but emits a photon of green light that is detected by the circuitry 662 which can be a sensor of any of the kinds described herein.

While the FIG. 6C embodiment contemplates using the wavelength-converting phosphor over an entire surface of the device, it is also possible to use a pixelation effect. A shadow mask is used to mask the phosphor. The phosphor is only deposited where allowed by the shadow mask.

It should also be understood that these same techniques could be embodied in other focal plane and photodiode applications, and that the above color filter array is not limited to single readout circuit per pixel systems.

Preferably, the focal plane array corresponding to FIGS. 1–4 is implemented in MOS silicon or CMOS, or any other technology which is compatible with an industry standard CMOS fabrication process. Preferably, each of the FETs is a MOSFET, the FETs 55, 60, 65, 200 and 225 being n-channel devices and the FETs 210, 220, 225, 230, 240, 245 being p-channel devices. The n-channel MOSFETS and the CCD channel underlying the gate electrodes 30, 35, 45 and the diffusions 40 and 50 may be located in a p-well while the remaining (p-channel) devices are located outside of the p-well. The gate voltage VLP applied to the gates of the p-channel channel load FETs 215 and 235 is a constant voltage on the order of +2.5 volts. The gate voltage VLN applied to the n-channel load FET 65 is a constant voltage on the order of +1.5 volts.

The charge transfer section 14 preferably uses only a single CCD stage between the photogate 12 and the floating diffusion 40 in the specific embodiment of FIG. 3A. This means that there is no loss due to charge transfer inefficiency and therefore there is no need to fabricate the device with any kind of special CCD process. As a result, the readout circuit 70 as well as the output circuitry of the FETs 55, 60 and 65 can be readily implemented as standard CMOS circuits, making them relatively inexpensive. However, any suitable charge coupled device architecture may be employed to implement the charge transfer section 14, including a CCD having more than one stage. For example, two or three stages may be useful for buffering two or three integration periods.

Other implementations of the concept of the invention may be readily constructed by the skilled worker in light of the foregoing disclosure. For example, the floating diffusion 40 may instead be a floating gate electrode. The signal and reset sample and hold circuits of the readout circuit 70 may be any suitable sample and hold circuits. Moreover, shielding of the type well-known in the art may be employed defining an aperture surrounding the photogate 12. Also, the invention may be implemented as a buried channel, n-well, or p-channel device.

Another feature of the invention which is useful for eliminating fixed pattern noise due to variations in FET threshold voltage across the substrate 20 is a shorting FET 116 across the sampling capacitors 205, 235. After the accumulated charge has been measured as the potential difference between the two output nodes VOUTS and VOUTR, a shorting signal VM is temporarily applied to the gate of the shorting FET 116 and the VOUTS-to-VOUTR difference is measured again. This latter difference is a measure of the disparity between the threshold voltages of the output FETs 210, 240, and may be referred to as the fixed pattern difference. The fixed pattern difference is subtracted from the difference between VOUTS and VOUTR measured at the end of the integration period, to remove fixed pattern noise.

As previously mentioned herein, a floating gate may be used instead of the floating diffusion 40. Such a floating gate is indicated schematically in FIG. 3A by a simplified dashed line floating gate electrode 41.

In one preferred implementation, the area of the L-shaped photogate 12 (i.e., the photogate electrode 30) was about 100 square microns; the transfer gate electrode 35 and the reset gate electrode were each about 1.5 microns by about 6 microns; the photogate signal PG was varied between about +5 volts (its more positive voltage) and about 0 volts (its less positive voltage; the transfer gate signal TX was about +2.5 volts; the reset signal RST was varied between about +5 volts (its more positive voltage) and about +2.5 volts (its less positive voltage); the drain diffusion 50 was held at about +5 volts.

The array structure of FIGS. 1–4 can be modified to incorporate a preferred column parallel approach. The term column parallel approach refers to a portion of the readout circuitry being connected to the bottom on the columns of the array. This allows an entire row of the array to be processed at one time. This column approach is in contrast to a spatially parallel processing approach where each pixel has its own processing circuitry (e.g., the embodiment of FIGS. 1–4), or a serial processing approach where the output of each pixel is sequentially feed to a single processor for processing.

Figure 3B:
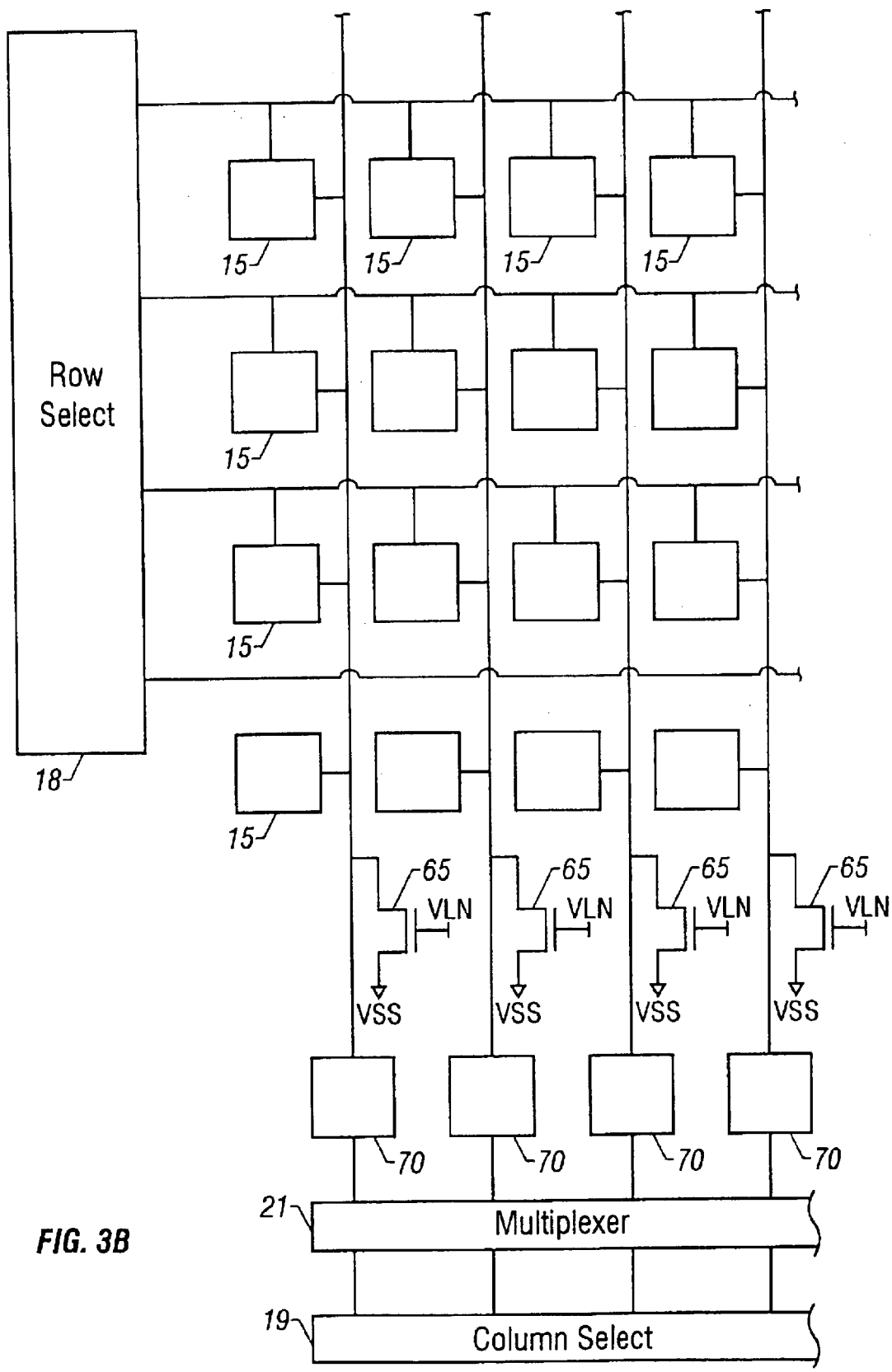
FIG. 3B is a plan view of an integrated circuit constituting a focal plane array of cells of a type similar to FIG. 1, where the load FET and sampling circuit is deleted from each cell and incorporated as common elements at the bottom of each array column.

FIG. 3B shows a column parallel approach where the load FET 65 and correlated double sampling circuit 70 are deleted from the individual pixel cells 10. Instead, each cell 10 in a column of the array is connected to a common load FET 65 and sampling circuit 70. The common elements are preferably located at the bottom of each column of the array. This column parallel array structure has a significant advantage. Since the load FET 65 and sampling circuit 70 have been removed from the pixel cells 10, there is more photosensitive cell area available. Thus, the resolution of each cell 10 is improved. The column parallel array structure is read out by selecting an entire row using standard row and column select circuitry 18, 19. Selecting a row, among other things, results in the accumulated charge being transferred from the photogate potential well 80 of each cell 10 in the row to its associated floating diffusion 40. Thereafter, the sampling circuits 70 at the bottom of each column "read" the connected pixel cell 10 in the manner described previously. A standard multiplexer 21 is then employed to output the "read" pixel cell values, either in parallel or serially.

The previous described pixel cell structure of FIGS. 3A and 4 (or the modified structure discussed in connection with FIG. 3B) can be further modified to allow for the simultaneous integration of the array. In the originally described structure of the pixel cell, charge accumulated in the photogate well 80 during the integration period was transferred directly to the floating diffusion 40. However, not all the cells in the array can be read out at the same time. Charge transferred to the floating diffusion 40 tends to degrade over time and therefore any signal therefrom is degraded with time. Therefore, only the accumulated charge for pixel cells that are currently being read out is preferably transferred. For example, as described in connection with the embodiment of FIG. 3B, only a row of the array is read out at one time. Since only a portion of the array is read out, some provision must be made to prevent further accumulation of charge in the other cells. In the previously described embodiments, this is done by integrating only those cells which are to be read out. Thus, the resulting image, once all the cells have been integrated and read, represents a series of lines, each corresponding to the observed scene at a different time. As discussed previously, if the observed scene is changing quickly, the resulting image will be motion-skewed.

FIG. 6 shows the technique of the present invention. Two additional gates are incorporated into the basic cell structure. These include an intermediate transfer gate 255, and a storage gate electrode 260 which overlies a storage potential well 265 in the substrate. The storage well 265 preferably has the same surface area as the photogate well 80. This ensures that all the charge accumulated in the photogate well 80 can be transferred to the storage well 265. In addition, it is preferred that the non-photosensitive portion of the pixel cell be shielded from optical radiation by an opaque layer 270, e.g., a metal layer. The non-photosensitive portion of the cell includes the area underlying the intermediate transfer gate 255 and storage gate 260, as well as the transfer gate 35, floating diffusion 40, reset gate 45, and V+drain 50. This optical shielding layer 270 minimizes the possibility that optically generated noise affects the charge stored in the storage well 265, or the other identified structures.

The process for operating this modified pixel cell is similar to that described previously, except that the charge accumulated under the photogate electrode 30 during the integration period is transferred across the intermediate transfer gate 255 and into the storage potential well 265, where it remains until readout. This is accomplished by decreasing the voltage of the signal on the photogate electrode 30, which is initially at a higher positive voltage than the intermediate transfer gate 255, to less than that of the intermediate gate 255. This operation forms the potential barrier 105 beneath the photogate electrode 30, thereby providing a downward staircase surface potential form the photogate electrode 30 to the storage well 265 (which is being held at a higher positive voltage than the intermediate transfer gate 255). During readout, the floating diffusion node 40 is reset and the reset voltage sampled, as discussed previously. Next, the charge is transferred from the storage well 265 over the transfer gate potential 85 and into the floating diffusion node 40, where it is sampled, in the same way the charge was transferred from the photogate well 80 to the node 40 in the first-described embodiment (of FIGS. 3A–B and 4).

The storage well 265 charge is transferred from the charge from the photogate well 80 to the storage well 265 after the integration period. This allows simultaneous integration realized. All the pixel cells (or a part thereof if desired) can be used to image the observed scene for the duration of the prescribed integration period, regardless of when each individual cell is to be read out, because the accumulated charge in each cell is transferred to its associated storage well 265 at the end of the integration period. In this way a "snapshot" image is stored. The storage well 265 provides a stable structure in which to store the transferred charge. Accordingly, the accumulated and transferred charge can remain in the storage well 265, substantially isolated from noise or leakage, until the time of readout for that cell. Only then is the charge transferred to the floating diffusion 40. Thus, there is little degradation of the signal produced even though the charge was stored for some period of time.

This simultaneous integration pixel cell structure trades off the fill factor of the cell. The intermediate transfer gate 255 and storage gate 260 take up room on the substrate and are shielded from optical radiation. Therefore, the proportion of the cell that is actively photosensitive is reduced. This may have the effect of lowering the resolution of the cell for any particular cell size. A lens over the shielded space can be used to recapture some of the light that falls on that shielded area.

Another embodiment of the present invention extends the dynamic range of the sensor array by using a non-destructive readout capability. Non-destructive reading of a pixel allows the pixel to be read multiple times. For example, in low light imaging applications, the signal output of a pixel cell can be integrated over several frame periods (i.e., multiple readouts) until the signal reaches some prescribed threshold. This allows relatively faint objects to be imaged by repeatedly increasing the accumulated charge, until enough charge exists to produce a readable output signal.

The inventors herein suggest using a non-destructive readout floating gate structure to substitute for the floating diffusion structure. The floating gate structure allows for non-destructive readout because the accumulated charge does not have to be drained during the readout process. The floating gate embodiment of the previously described active pixel image sensor (of FIG. 3A) would be acceptable in many applications where a non-destructive readout was desired. A simplified floating gate pixel structure is described below which has the additional advantage of allowing a smaller pixel size due to its fewer components, and so be suitable for high-density arrays.

Figure 7:
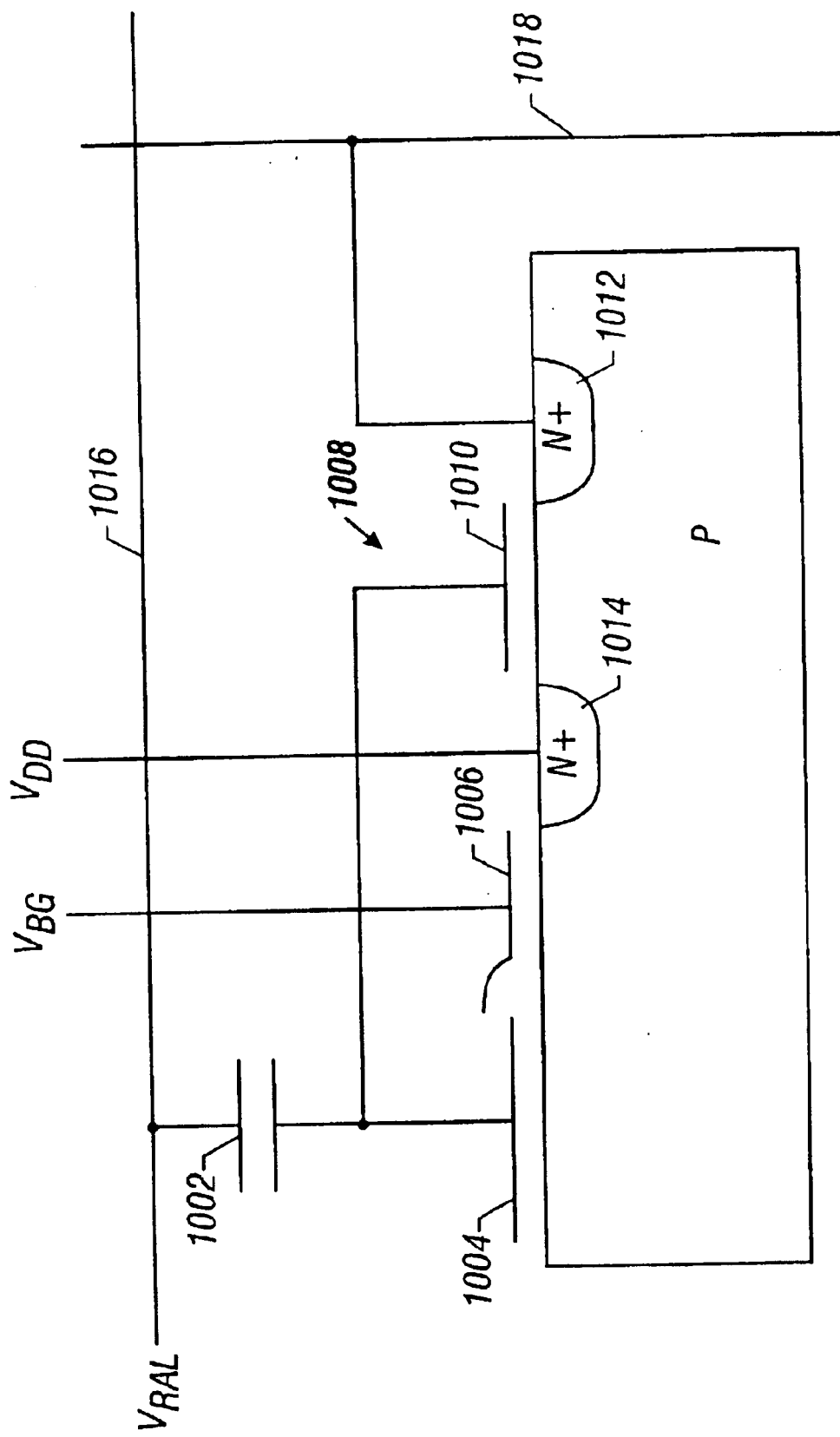
FIG. 7 is a schematic diagram of a Simple Floating Gate (SFG) pixel cell.

This simplified floating gate pixel structure is shown in FIG. 7. The Simple Floating Gate (SFG) pixel uses a coupling capacitor 1002, a photogate 1004, a barrier gate 1006, and an output transistor 1008. The output transistor 1008 is preferably an n-channel MOSFET having a gate 1010, a source diffusion 1012, and a drain diffusion 1014. The drain diffusion 1014 also acts as a reset drain during the reset operation. Drain diffusion is later used as an overflow drain during the integration period. The photogate 1004 is capacitively coupled, to a row address line 1016 associated with the row of pixels to which the depicted pixel belongs, through the coupling capacitor 1002. In addition, the photogate 1004 is connected to the gate 1010 of the output transistor 1008. This photogate connection configuration in effect creates a floating gate. The source diffusion 1012 of the output transistor 1008 is coupled to a column signal line 1018 which is associated with the column of pixels to which the depicted pixel belongs.

Figure 8:
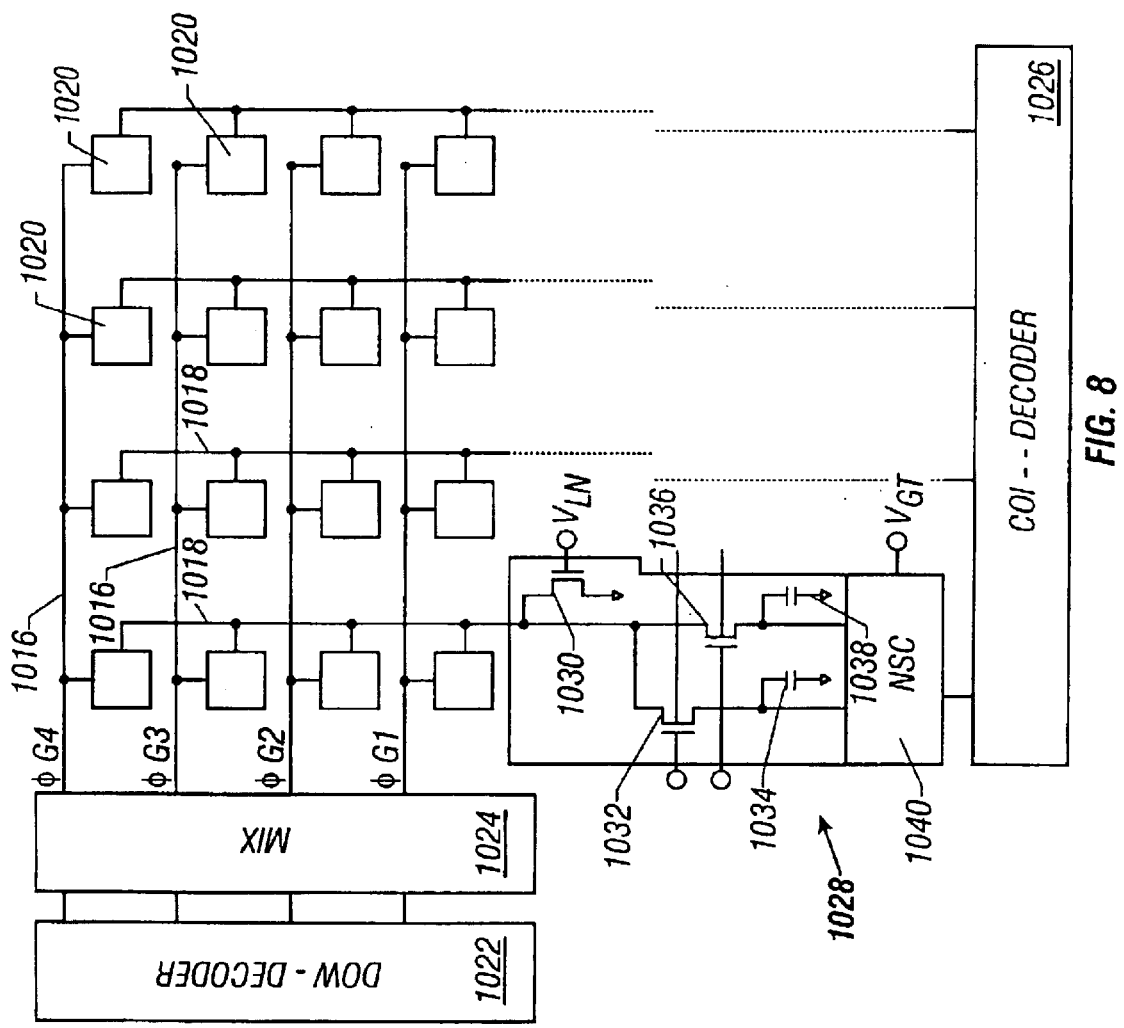
FIG. 8 is a diagram illustrating the architecture of an integrated circuit constituting a focal plane array of the SFG pixel cells of FIG. 7.

FIG. 8 exemplifies the general structure of an array of SFG pixels 1020; in this case a 4×4 array. Each pixel is connected to a row address line 1016 and a column signal line 1018 associated with the pixel's respective row and column in the array. The row address lines 1016 are ultimately connected to the row decoder 1022. However, these row lines 1016 are also connected through a voltage level mixing circuit 1024. This mixing circuit 1024 is used to generate row address line biases and pulses with one of three different voltage levels. The purpose for these different voltage levels will be discussed later in this disclosure.

The column signal lines 1018 are ultimately connected to the column decoder 1026, as in previous embodiments. In addition, the present embodiment preferably employs the previously-described column parallel architecture to maximize the photosensitive area of each pixel. Accordingly, between the array and the column decoder 1026 at the bottom of the array, each of the column signal lines 1018 is connected to a separate readout circuit 1028. Thus, one readout circuit 1028 is common to all the pixels 1020 forming the corresponding column of the array. The preferred readout circuit 1028 is the same as the correlated double sampling circuit described previously with reference to FIG. 3. This circuit includes a load transistor 1030 connected to the associated column signal line 1018. This load transistor 1030 is preferably an n-channel MOSFET which acts as an active load. The load transistor 1030 and the output transistor 1008 (of FIG. 7) resident in the connected pixels 1020 form a source follower. Each column signal line 1018 is also connected to a pair of sample and hold circuits. The first sample and hold circuit consists of a signal transistor 1032 and a signal capacitor 1034. The second sample and hold circuit has a reset transistor 1036 and reset capacitor 1038. The gate of each signal transistor 1032 is connected to a sample and hold signal (SHS), which, when present, causes the voltage output of a selected pixel in the associated column of the array to be stored at the corresponding signal capacitor 1034. Similarly, the gate of each reset transistor 1036 is connected to a sample and hold reset signal (SHR) which when present causes the voltage output of the selected pixel in the associated column to be stored at the corresponding reset capacitor 1038. The signal and reset capacitors 1034, 1038 are also connected to a noise suppression circuit ("NSC") 1040. NSC 1040 operates as in previous embodiments to subtract the reset level held at the reset capacitor 1038 from the signal level held at the signal capacitor 1034 thereby eliminating the effects of kTC noise, and to differentiate this derived level from a level obtained after shorting across the capacitors 1034, 1038 thereby eliminating fixed pattern noise.

FIGS. 9A–9C shows graphs of surface potential. The drain diffusion 1014 is DC biased at a relatively high voltage $V_{DD}$ (e.g., 5.0 V) and the barrier gate 1006 is DC biased at a lower voltage $V_{BG}$ (e.g., 1.25 V). These biases remain the same throughout the integration, readout, and reset cycles of the image sensor to create a constant potential well 1042 under the drain diffusion 1014 and potential barrier 1044 under the barrier gate 1006. FIG. 9A illustrates the integration period, the row address line 1016 is biased at the integration voltage, i.e., $V_{RAL}=V_{INT}$, which is larger than the barrier gate bias voltage $V_{BG}$. This creates a potential well 1046 under the photogate 1004 wherein photon-induced signal electrons are accumulated for the duration of the integration period. However, the aforementioned barrier gate bias voltage $V_{BG}$ is also chosen to provide antiblooming control, similar to that discussed in connection with the shutter gate embodiments of the invention. In this case, when the amount of accumulated charge exceeds a level determined by the barrier gate bias voltage $V_{BG}$, the excess is drained into the drain diffusion potential well 1042.

Readout is accomplished by pulsing the row address line 1016 to a readout voltage, i.e., $V_{RAL}=V_{RD}$, which is larger than the integration voltage $V_{INT}$. The floating gate potential, which depends on the amount of the accumulated signal charge, is sensed by the source follower circuit formed by the output and load transistors 1008, 1030. The readout voltage $V_{RD}$ is made larger than the integration voltage $V_{INT}$ to differentiate the output of the pixels in the selected row of the array from the non-selected pixels in other rows, thus eliminating so-called "dark-clipping". Specifically, the readout voltage $V_{RD}$ is made sufficiently larger than the integration voltage $V_{INT}$, so that only the pixel 1020 in the column of the array with the larger readout voltage bias (i.e., $V_{RD}$) is sensed by the source follower circuit. The selected pixel is sensed exclusive of the non-selected pixels in the column because of the common load configuration described above. Therefore, a winner-take-all circuit is created with the readout voltage biased pixel 1020 always being the winner. In a tested embodiment a 1 volt difference, where $V_{RD}=5$ V and $V_{INT}=4$ V, was sufficient to differentiate the selected pixel from the non-selected pixels. The readout phase of the operation is illustrated in FIG. 9B.

Finally, reset is accomplished by biasing the row address line 1016 at a reset voltage, i.e., $V_{RAL}=V_{RS}$, which is preferably ground potential (i.e., 0 V). As shown in FIG. 9C, this creates a downward staircase surface potential from the region underlying the photogate 1004, across the potential barrier 1044 under the barrier gate 1006, to the potential well 1042 under the drain diffusion 1014. Thus, the signal charge accumulated under the photogate 1004 is completely drained and the pixel 1020 is reset. Since the photogate region is completely drained during reset, the SFG pixel will exhibit no kTC noise, and no image lag.

The readout and reset operations are preferably used in combination to perform the aforementioned noise suppression tasks. First, after the integration period is complete, the readout voltage $V_{RD}$ is applied to the selected row of the array (via the corresponding row address line 1016) and the signal level is sampled from each pixel 1020 in the row and held on the associated signal capacitor 1034 at the bottom of the array column. Next, the row address line 1016 is biased at the reset voltage $V_{RS}$, thereby resetting the pixel 1020. The row address line 1016 is then again biased at the readout voltage $V_{RD}$ and the reset pixel level of each pixel 1020 in the selected row is sampled and held on the corresponding reset capacitors 1038. During the next integration period, the stored signal and reset levels from each of the previously selected pixels are read out in parallel to the noise suppression circuit 1040 and operated upon as discussed previously. The noise-suppressed pixel levels are then readout via a multiplexer (not shown) as in previously described embodiments of the invention.

A tradeoff exists between the dynamic range of a SFG pixel cell (i.e., the maximum amount of charge that can be accumulated before saturation) and its sensitivity (i.e., the voltage level associated with the amount of charge accumulated). The saturation level $N_{sat}$ increase as the ratio $\beta$ between the capacitance $C_O$ of the coupling capacitor 1002 and the capacitance $C_{PG}$ associated with the photogate 1004, while the sensitivity S decreases, where:

$$N_{sat}=(C_{tot} \times V_{sat,PG})/q \quad (4)$$

$$C_{tot}=C_{dep}+[(C_O+C_{ol}+C_g)/(C_{PG}+C_O+C_{ol}+C_g)] \quad (5)$$

$$S=q/[C_{dep}+1/C_{PG} \times \{(C_{PG}+C_{dep}) \times (C_O+C_{ol}+C_g)\}] \quad (6)$$

$C_{dep}$ being the depletion capacitance of the photogate 1004, $C_{ol}$ being the overlap capacitance coupled to the to the floating gate, and $C_g$ being the gate capacitance of the output transistor 1008. Thus, for a given photogate capacitance ($C_{PG}$), larger coupling capacitor values will result in higher saturation levels, but lower sensitivity. This result is not too surprising since larger coupling capacitor values require physically larger capacitor structures in the pixel cell, and so a lower fill factor, i.e., less "effective" photosensitive area. The term "effective" photosensitive area is used because, although, the coupling capacitor structure does significantly reduce the amount of photogenerated charge thereunder, some is still produced. Thus, the fill factor is not a straight ratio of the physical photogate area to the total area. For tested embodiments of the SFG sensor array, a β=0.5 was chosen as a compromise between saturation levels and sensitivity. However, a different β value could be used to favor either a higher saturation level or a higher sensitivity depending on the requirements of the desired application. It is also noted that the previously described microlens structure could be incorporated into the SFG pixel array to increase the effective fill factor by concentrating the received light on the actively photosensitive region under the photogate. This increased effective fill factor would then improve the sensitivity of the cell.

The aforementioned tested sensor array has 32(H)×27(V) pixels with a pixel size of only 40×40 $\mu m^2$. The chip was implemented in a 2 $\mu m$ double-poly n-well CMOS process. The output saturation voltage was measured to be 180 mV under the condition where $V_{DD}$=5 V, $V_{INT}$=4.0 V, $V_{RD}$=5 V, $V_{RS}$=0v, and $V_{BG}$=1.25 V. Good linearity was obtained in that the photogate voltage varied linearly with the amount of accumulated charge. Fixed pattern noise was suppressed to 1 $mV_{p-p}$. In addition, no blooming was observed. Read noise was measured to be 215 $\mu V_{rms}$.

While the invention has been described in detail by reference to the preferred embodiment described above, it is understood that variations and modifications thereof may be made without departing from the true spirit and scope of the invention. For example, the switched capacitor integrators described in connection with the second preferred implementation of the multiresolution readout circuit could be replaced with switched capacitor filters. The switched capacitor filters would be designed to perform a low pass filtering and pixel weighting operation instead of just simple signal averaging. In this way, a more sophisticated block processing procedure can be realized.

What is claimed is:

1. An imaging device, comprising:
    a monolithic semiconductor integrated circuit substrate;
    a focal plane array of pixel cells, each one of said pixel cells comprising:
        a photodetector having a photodetector portion formed in said substrate and a photodetector electrode overlying said photodetector portion, said photodetector operable to accumulate photo-generated charge in said photodetector portion in response to incident radiation, and
        a charge coupled device section formed on said substrate adjacent said photodetector and having an output transistor whose gate is connected to said photodetector electrode to form a floating gate and at least one charge coupled device stage, said charge coupled device section configured and operable to transfer charge through said charge coupled device stage from said photodetector portion of said substrate to a drain of said output transistor during a reset operation and to produce an electrical signal indicative of said photo-generated charge.

2. The imaging device of claim 1 wherein said charge coupled device stage comprises a transfer gate between said drain of said output transistor and photodetector portion.

3. The imaging device of claim 2, wherein said charge coupled device section includes a capacitor having a first terminal coupled to both said floating gate of said output transistor and said photodetector electrode and a second terminal to receive a row address voltage signal that is at an integration voltage higher than a barrier potential at said transfer gate during an integration period and is at a readout voltage which is higher than said integration voltage during a readout period.

4. The imaging device of claim 1 further comprising means for periodically resetting a potential of said floating gate to a predetermined potential.

5. The imaging device of claim 1, wherein each one of said pixel cells further comprises:
    a drain diffusion connected to a drain bias voltage; and
    a reset gate located between said floating gate of said output transistor and said drain diffusion and coupled to receive a reset control signal that controls said reset operation.

6. The imaging device of claim 1, further comprising a readout circuit which includes a field effect source follower output transistor having a gate coupled to receive an output from said floating gate of said output transistor.

7. The imaging device of claim 6, wherein said readout circuit further comprises a field effect load transistor connected to said source follower output transistor.

8. The imaging device of claim 7, wherein said readout circuit further comprises a correlated double sampling circuit having an input node connected between said source follower output transistor and said load transistor.

9. The imaging device of claim 8, wherein the correlated double sampling circuit comprises:
    a pair of sample and hold field effect transistors formed in said substrate, each sample and hold field effect transistor having one of a source and drain thereof connected to a source of said source follower transistor;
    a pair of sample and hold capacitors connected to the other one of the source and drain of a respective one of said pair of sample and hold transistors; and
    means for sensing a potential of each of said sample and hold capacitors at respective intervals.

10. The imaging device of claim 9 further comprising means for sensing a difference between potentials of said pair of sample and hold capacitors.

11. The imaging device of claim 9 further comprising means for shorting across each of said pair of sample and hold capacitors simultaneously while said means for sensing measures a fixed pattern noise difference.

12. The imaging device of claim 9, wherein said focal array of pixel cells is organized in rows and columns, and wherein said readout circuit further comprises a plurality of load transistors and correlated double sampling circuits, wherein each cell in each column of pixel cells is connected to a single common load transistor and a single common correlated double sampling circuit.

13. The imaging device of claim 12, wherein each of said common load transistors and correlated double sampling circuits is disposed at an end of a respective column of pixel cells connected thereto.

14. The imaging device of claim 12, wherein said readout circuit further comprises:
    a row select field effect transistor formed in each one of said cells having its source and drain connected between said source of said source follower output transistor and said pair of sample and hold transistors, and a gate connected to a row select signal; and
    wherein said means for sensing at period intervals comprises, a pair of sample and hold output transistors having respective gates and sources connected across respective ones of said pair of sample and hold capacitors, and having respective drains, respective differential output nodes of said correlated double sampling circuit, and a pair of column select transistors formed in said substrate each having a source and drain connected between a drain of a respective one of said sample and hold output transistors and a gate connected to a column select signal.

15. The imaging device of claim 14, wherein each of said transistors is a metal oxide field effect transistor, said source follower output transistor, said load transistor, said row select transistor, and said pair of sample and hold transistors being n-channel devices, said pair of sample and hold output transistors and said pair of column select transistors being p-channel devices.

16. The imaging device of claim 1 further comprising a micro-lens layer overlying said substrate, said micro-lens layer comprising:

a refractive layer; and individual lenses formed in said layer in registration with individual ones of said cells, each of said individual lenses having a curvature for focusing light toward a photosensitive portion of the respective cell.

17. The imaging device of claim 16, wherein said refractive layer comprises a polymer.

18. The imaging device of claim 17 wherein said refractive layer comprises polyamide.

19. The imaging device of claim 16, wherein each of said individual lenses covers portions of the corresponding cell including said photodetector as well as said charge coupled device section.

20. The imaging device of claim 1, further comprising CMOS image signal processing electronics integrated on said substrate and connected to communicate with said focal plane array, said CMOS image signal processing electronics providing on-chip signal processing of electrical signals from said pixel cells.

21. An imaging device, comprising:

a monolithic semiconductor integrated circuit substrate;

a focal plane array of pixel cells formed on said substrate by an integrated circuit process that is compatible with a complementary metal oxide semiconductor (CMOS) process, each one of said pixel cells comprising:

a photodetector electrode overlying said substrate and operable to accumulate photo-generated charge in an underlying photodetector portion of said substrate, a barrier gate formed on said substrate adjacent said photodetector portion, and a pixel transistor formed on said substrate and configured to have a first diffusion region adjacent said barrier gate, a gate and a second diffusion region, said gate connected to said photodetector electrode to form a floating gate, wherein said barrier gate is operable to transfer said photo-generated charge from said underlying photodetector portion of said substrate to said first diffusion region of said pixel transistor, and wherein said gate of said pixel transistor produces an electrical signal comprising a signal component indicative of said photo-generated charge and a noise component indicative of noise associated with said pixel; and MOS image signal processing electronics integrated on said substrate and connected to communicate with said focal plane array and to provide on-chip signal processing of electrical signals from said pixel cells.

22. The imaging device of claim 21, wherein said first diffusion region is a floating node to function as a source of said pixel transistor and said second diffusion region is biased at a selected DC voltage to function as a drain, said first diffusion region converting said photo-generated charge into said electrical signal.

23. The imaging device of claim 22, further comprising:

a readout circuit formed on said substrate and comprising a field-effect source follower output transistor coupled to receive said electrical signal from said pixel transistor;

a field-effect load transistor connected to said source follower output transistor; and a correlated double sampling circuit having an input node connected between said source follower output transistor and said load transistor and operable to produce an output signal indicating only said photo-generated charge, wherein said sampling circuit samples said electrical signal once when said gate of said pixel transistor is set at a first gate potential without changing an amount of photo-generated charge in said first diffusion region and to sample said electrical signal for a second time when said gate of said pixel transistor is set at a second gate potential.

24. The imaging device of claim 21, wherein said first diffusion region is biased at a selected DC voltage to function as a drain.

25. The imaging device of claim 24, wherein each pixel cell further comprises a capacitor having a first terminal connected to both said photodetector electrode and said gate of said pixel transistor.

26. The imaging device of claim 24, further comprising:

a readout circuit comprising a field-effect source follower output transistor formed in each one of said cells, the second diffusion region of said pixel transistor being connected to a gate of said source follower output transistor;

a field-effect load transistor connected to said source follower output transistor; and a correlated double sampling circuit having an input node connected between said source follower output transistor and said load transistor and operable to sample said second diffusion region twice in an readout operation to produce an output signal indicating only said photo-generated charge.

27. An imaging device, comprising:

a monolithic semiconductor integrated circuit substrate;

a focal plane array of pixel cells formed on said substrate by an integrated circuit process that is compatible with complementary metal oxide semiconductor (CMOS) process, each one of said pixel cells comprising, a photodetector electrode overlying said substrate and operable to accumulate photo-generated charge in an underlying portion of said substrate, a barrier gate formed on said substrate adjacent said underlying portion, and a pixel transistor formed on said substrate and configured to have a drain adjacent said barrier gate, a gate and a source, a capacitor having a terminal connected to both said photodetector electrode and said gate of said pixel transistor to make said gate of said pixel transistor a floating gate, wherein said barrier gate is operable to transfer said photo-generated charge from said underlying portion of said substrate under said photodetector electrode to said drain of said pixel transistor which produces an electrical signal having a signal component indicative of said photo-generated charge.

28. The imaging device of claim 27, further comprising a readout circuit formed on said substrate to receive said electrical signal, said read circuit comprising:
- a field-effect source follower output transistor coupled to receive said electrical signal;
- a field-effect load transistor connected to said source follower output transistor; and
- a correlated double sampling circuit having an input node connected between said source follower output transistor and said load transistor and operable to sample said second diffusion region twice in a readout operation to produce an output signal indicating only said photo-generated charge.

29. The imaging device of claim 27, further comprising CMOS image signal processing electronics integrated on said substrate and connected to communicate with said focal plane array, said CMOS image signal processing electronics providing on-chip signal processing of electrical signals from said pixel cells.

30. A method, comprising:
- producing charge in a portion of a semiconductor substrate under a photodetector electrode in response to incident photons incident to said portion;
- using a transfer gate formed in said substrate next to said portion under said photodetector electrode to output said charge;
- using a drain of an output transistor formed in said substrate next to said transfer gate to receive said charge from said portion; and
- connecting a gate of said output transistor to said photodetector electrode to form a floating gate so as to convert said charge into an electrical signal.

31. A method as in claim 30, further comprising biasing said drain at a DC voltage.

32. A method as in claim 30, further comprising:
- coupling a first terminal of a capacitor to both said photodetector electrode and said gate of said output transistor;
- using a second terminal of said capacitor to receive a row address voltage; and
- using a source of said output transistor to receive a row address voltage.

33. A method as in claim 32, further comprising:
- setting said row address voltage at an integration voltage higher than a barrier potential at said transfer gate during an integration period; and
- setting said row address voltage at a readout voltage which is higher than said integration voltage during a readout period.

* * * * *